United States Patent
Lin et al.

(10) Patent No.: US 8,619,932 B2
(45) Date of Patent: Dec. 31, 2013

(54) SIGNAL TRANSMISSION SYSTEM WITH CLOCK SIGNAL GENERATOR CONFIGURED FOR GENERATING CLOCK SIGNAL HAVING STEPWISE/SMOOTH FREQUENCY TRANSITION AND RELATED SIGNAL TRANSMISSION METHOD THEREOF

(75) Inventors: Yu-Wei Lin, Hsinchu (TW); Chih-Chien Hung, Hualien County (TW); Tsang-Yi Wu, Hsinchu (TW)

(73) Assignee: Mediatek Inc., Science-Based Industrial Park, Hsin-Chu (TW)

( * ) Notice: Subject to any disclaimer, the term of this patent is extended or adjusted under 35 U.S.C. 154(b) by 282 days.

(21) Appl. No.: 13/109,015

(22) Filed: May 17, 2011

(65) Prior Publication Data
US 2012/0063534 A1 Mar. 15, 2012

Related U.S. Application Data

(60) Provisional application No. 61/383,031, filed on Sep. 15, 2010.

(51) Int. Cl.
*H04L 7/00* (2006.01)

(52) U.S. Cl.
USPC .......................................... 375/355; 348/537

(58) Field of Classification Search
USPC .......... 375/259, 295, 354, 355, 376; 327/141, 327/156, 162; 713/500, 503; 348/500, 537
See application file for complete search history.

(56) References Cited

U.S. PATENT DOCUMENTS

| | | | |
|---|---|---|---|
| 6,636,575 B1 * | 10/2003 | Ott | 375/354 |
| 2005/0245200 A1 * | 11/2005 | Kluge et al. | 455/76 |
| 2007/0263122 A1 * | 11/2007 | Araki | 348/536 |
| 2008/0169849 A1 * | 7/2008 | Chatwin | 327/148 |
| 2009/0147897 A1 * | 6/2009 | Shin | 375/355 |
| 2010/0020250 A1 * | 1/2010 | Okamoto et al. | 348/739 |

FOREIGN PATENT DOCUMENTS

| | | |
|---|---|---|
| CN | 1892755 A | 1/2007 |
| EP | 0 432 539 A2 | 6/1991 |
| EP | 0 432 539 A3 | 6/1991 |
| EP | 1 184 987 A1 | 3/2002 |
| EP | 1 791 261 A2 | 5/2007 |
| EP | 1 791 261 A3 | 7/2007 |
| KR | 1020050008880 A | 1/2005 |
| KR | 100899781 B1 | 5/2009 |
| WO | 9908383 A1 | 2/1999 |

\* cited by examiner

*Primary Examiner* — Betsy Deppe
(74) *Attorney, Agent, or Firm* — Winston Hsu; Scott Margo

(57) ABSTRACT

A signal transmission system includes a first clock signal generator and a second clock signal generator. The first clock signal generator is configured for generating a first clock signal according to clock information derived from a transmitted signal, wherein the transmitted signal is changed in response to a frequency change of a second clock signal, and the first clock signal generator enters a frequency-unlocked state if the second clock signal has a frequency transition from a first frequency to a second frequency during a first time period. The second clock signal generator is configured for generating the second clock signal having the frequency transition from the first frequency to the second frequency during a second time period longer than the first time period such that the first clock signal generator stays in a frequency-locked state during the second time period.

20 Claims, 9 Drawing Sheets

SIGNAL TRANSMISSION SYSTEM WITH CLOCK SIGNAL GENERATOR CONFIGURED FOR GENERATING CLOCK SIGNAL HAVING STEPWISE/SMOOTH FREQUENCY TRANSITION AND RELATED SIGNAL TRANSMISSION METHOD THEREOF

CROSS REFERENCE TO RELATED APPLICATIONS

This application claims the benefit of U.S. provisional application No. 61/383,031, filed on Sep. 15, 2010 and incorporated herein by reference.

BACKGROUND

The disclosed embodiments of the present invention relate to generating a clock signal at a transmitting end and recovering a clock signal at a receiving end, and more particularly, to a signal transmission system with a clock signal generator configured for generating a clock signal having a stepwise/smooth frequency transition and related signal transmission method thereof.

Clock signals are critical to normal operations of circuit components. When the circuit components are disposed in different chips, there is a need to make a processing result of one chip transmitted to the next chip for further processing. In addition, the clock signal used in one chip may be required to be used in the next chip for correctly dealing with the processing result generated from the preceding chip. One conventional design is to generate a clock signal at one chip (i.e., a receiving end) according to information given from a preceding chip (e.g., a transmitting end). However, when the frequency of the clock signal at the transmitting end has a significant change, the clock signal generated at the receiving end may fail to swiftly track the frequency variation of the clock signal generated at the transmitting end. Thus, the generation of the clock signal at the receiving end becomes unstable, leading to abnormal operation of the receiving end.

Taking the television (TV) video display for example, one image processing chip may be coupled to a timing controller chip, wherein the image processing chip may be utilized for processing an input video stream and generate an output video stream, and the timing controller chip may be utilized for referring to the output video stream for supplying a clock signal and image data signals synchronized with the clock signal to a display panel such as a liquid crystal display (LCD) panel. When the user changes the video source, the frame rate or the video resolution in a normal operation, the frequency of the clock signal at the transmitting end (i.e., the image processing chip) is changed accordingly. It is possible that the picture displayed on the display panel flickers because of the hardware limitation of a clock generator implemented at the receiving end (i.e., the timing controller chip). To avoid the flicker problem, the traditional method proposes terminating the transmission process between the transmitting end and the receiving end, waiting for a stable clock signal locked to a new frequency by the clock generator at the receiving end, and resuming the transmission process between the transmitting end and the receiving end after the stable clock signal with the new frequency is generated by the clock generator at the receiving end. However, in some TV testing criteria, terminating the transmission process between the transmitting end and the receiving end is not acceptable since the display panel would fail to show the on-screen display (OSD) status.

Thus, there is a need for an innovative signal transmission design which can solve the flicker problem without terminating the transmission process between the transmitting end and the receiving end.

SUMMARY

In accordance with exemplary embodiments of the present invention, a signal transmission system with a clock signal generator configured for generating a clock signal having a stepwise/smooth frequency transition and related signal transmission method thereof are proposed to solve the above-mentioned problem.

According to a first aspect of the present invention, an exemplary signal transmission system is disclosed. The exemplary signal transmission system includes a first clock signal generator and a second clock signal generator. The first clock signal generator is configured for generating a first clock signal according to clock information derived from a transmitted signal, wherein the transmitted signal is changed in response to a frequency change of a second clock signal, and the first clock signal generator enters a frequency-unlocked state if the second clock signal has a frequency transition from a first frequency to a second frequency during a first time period. The second clock signal generator is configured for generating the second clock signal having the frequency transition from the first frequency to the second frequency during a second time period longer than the first time period such that the first clock signal generator stays in a frequency-locked state during the second time period.

According to a second aspect of the present invention, an exemplary signal transmission method is disclosed. The exemplary signal transmission method includes: generating a first clock signal according to clock information derived from a transmitted signal, wherein the transmitted signal is changed in response to a frequency change of a second clock signal, and the first clock signal enters a frequency-unlocked state if the second clock signal has a frequency transition from a first frequency to a second frequency during a first time period; and generating the second clock signal having the frequency transition from the first frequency to the second frequency during a second time period longer than the first time period such that the first clock signal stays in a frequency-locked state during the second time period.

According to a third aspect of the present invention, an exemplary signal transmission system is disclosed. The exemplary signal transmission system includes a first clock signal generator and a second clock signal generator. The first clock signal generator is configured for generating a first clock signal according to clock information derived from a transmitted signal, wherein the transmitted signal is changed in response to a frequency change of a second clock signal, and the first clock signal generator enters a frequency-unlocked state if the second clock signal has a first frequency transition from one frequency to another frequency during a specific time period. The second clock signal generator is configured for generating the second clock signal having a second frequency transition from one frequency to another frequency during the specific time period, wherein the second frequency transition is less than the first frequency transition such that the first clock signal generator stays in a frequency-locked state during the specific time period.

According to a fourth aspect of the present invention, an exemplary signal transmission method is disclosed. The exemplary signal transmission method includes: generating a first clock signal according to clock information derived from a transmitted signal, wherein the transmitted signal is changed in response to a frequency change of a second clock signal, and the first clock signal enters a frequency-unlocked state if the second clock signal has a first frequency transition from one frequency to another frequency during a specific time period; and generating the second clock signal having a second frequency transition from one frequency to another frequency during the specific time period, wherein the second frequency transition is less than the first frequency transition such that the first clock signal stays in a frequency-locked state during the specific time period.

These and other objectives of the present invention will no doubt become obvious to those of ordinary skill in the art after reading the following detailed description of the preferred embodiment that is illustrated in the various figures and drawings.

DETAILED DESCRIPTION

Certain terms are used throughout the description and following claims to refer to particular components. As one skilled in the art will appreciate, manufacturers may refer to a component by different names. This document does not intend to distinguish between components that differ in name but not function. In the following description and in the claims, the terms "include" and "comprise" are used in an open-ended fashion, and thus should be interpreted to mean "include, but not limited to . . . ". Also, the term "couple/electrically connect" is intended to mean either an indirect or direct electrical connection. Accordingly, if one device is coupled to another device, that connection may be through a direct electrical connection, or through an indirect electrical connection via other devices and connections.

The main concept of the present invention is to make a clock generator at a transmitting end generate a clock signal having a stepwise/smooth frequency transition such that a clock generator at a receiving end is capable of tracking the frequency variation of the clock signal generated at the transmitting end. In other words, with a proper control applied to the frequency transition of the clock signal generated at the transmitting end, the clock signal generated at the receiving end is properly tuned to a new frequency. Thus, the receiving end can operate normally even though the frequency of the clock signal at the transmitting end is changed. Further details are described as follows.

Figure 1:
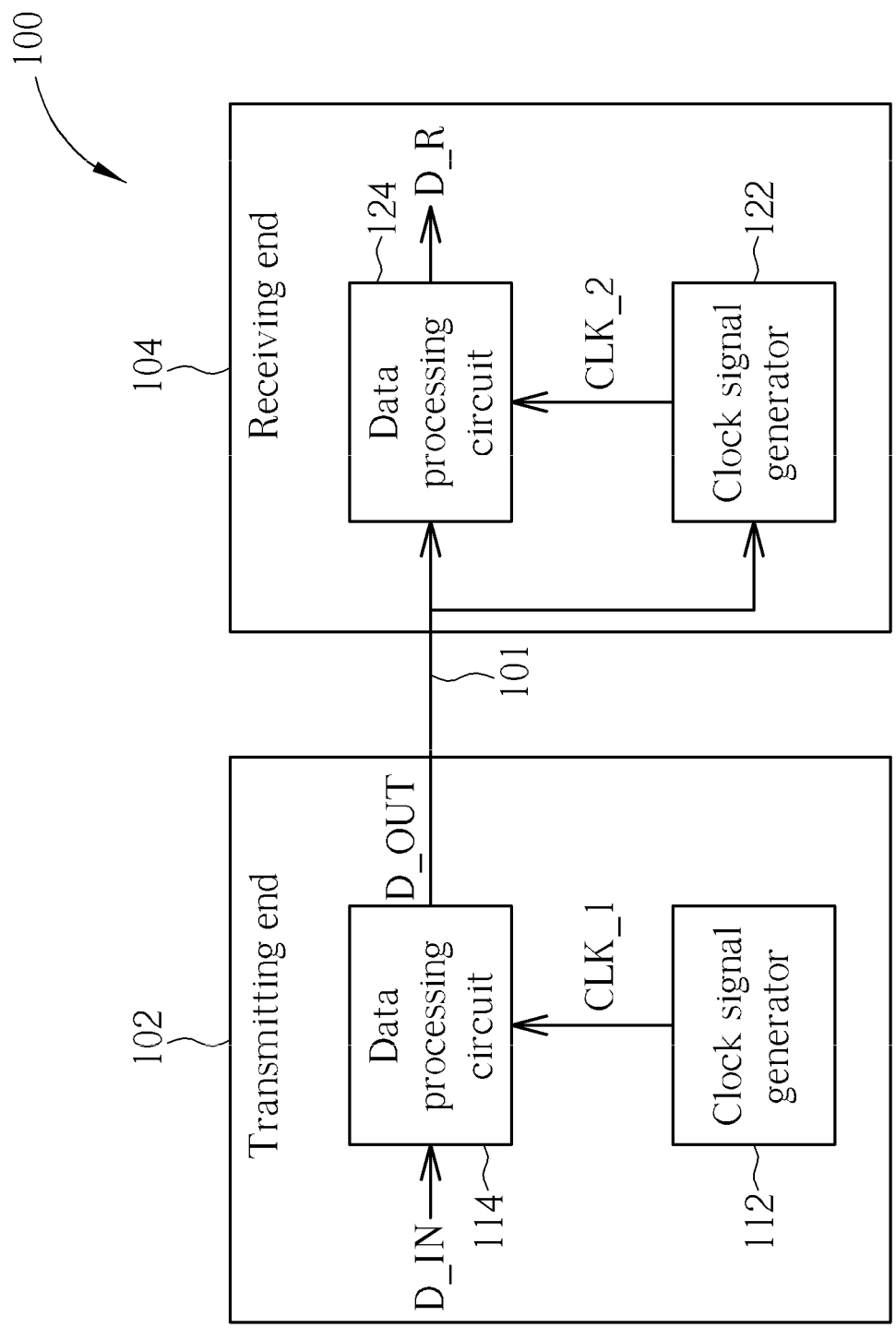
FIG. 1 is a diagram illustrating a signal transmission system according to a first exemplary embodiment of the present invention.

FIG. 1 is a diagram illustrating a signal transmission system according to a first exemplary embodiment of the present invention. The exemplary signal transmission system includes a transmitting end 102 and a receiving end 104, wherein the receiving end 104 is coupled to the transmitting end 102 via a transmission link 101. Regarding the transmitting end 102, it includes, but is not limited to, a clock signal generator 112 and a data processing circuit 114. Regarding the receiving end 104, it includes, but is not limited to, a clock signal generator 122 and a data processing circuit 124. By way of example, but not limitation, the transmission link 101 may be an internal display port (iDP) link or a V-by-One (VB1) link, the transmitting end 102 may be an image processing chip (e.g., a TV SoC), and the receiving end 104 may be a timing controller chip (e.g., a timing controller of a TV display panel). The data processing circuit 114 of the transmitting end 102 processes an input data stream D_IN according to a clock signal CLK_1, and accordingly generates an output data stream D_OUT acting as an output signal transmitted to the receiving end 104 via the transmission link 101. The data processing circuit 124 of the receiving end 104 obtains a received data stream D_R by receiving/processing the output data stream D_OUT according to a clock signal CLK_2. In this exemplary embodiment, the clock signal generator 122 generates the clock signal CLK_2 according to clock information derived from the output signal of the transmitting end 102. That is, the signal transmission system 100 employs a variable data rate scheme with embedded clock signal, and the clock signal generator 122 is equipped with clock and data recovery (CDR) capability.

As can be readily seen from FIG. 1, the output data stream D_OUT is changed in response to a frequency change of the clock signal CLK_1 since the data processing circuit 114 refers to the clock signal CLK_1 to generate the output data stream D_OUT. Therefore, the generation of the clock signal CLK_2 at the receiving end 104 would be affected by the frequency change of the clock signal CLK_1 generated at the transmitting end 102. In a case where the transmitting end 102 is the TV SoC and the input data stream D_IN is an input video stream, the clock signal CLK_1 is required to have a frequency transition from a first frequency (i.e., the current frequency) to a second frequency (i.e., the new frequency) when the user changes input source/frame rate/video resolution. However, due to the hardware limitation, the clock signal generator 122 may enter a frequency-unlocked state if the clock signal CLK_1 has the frequency transition FT1 from the first frequency $F_1$ to the second frequency $F_2$ during a first time period P1. That is, the clock signal CLK_2 enters the frequency-unlocked state and becomes unstable when the clock signal generator 122 enters the frequency-unlocked state. Please refer to FIG. 2, which is a diagram illustrating a hypothetical case where the clock signal generator 122 enters the frequency-unlocked state due to the frequency change of the clock signal CLK_1. At the time point T1, the frequency of the clock signal CLK_1 is changed from the first frequency $F_1$ toward the second frequency $F_2$. At the time point T2, the frequency of the clock signal CLK_1 reaches the second frequency $F_2$. As the frequency of the clock signal CLK_1 is swiftly changed within the first time period P1, the clock signal generator 122 fails to successfully and correctly track the frequency variation. As a result, the clock signal generator 122 leaves the frequency-locked state and enters the frequency-unlocked state. Thus, the frequency of the clock signal CLK_2 is unstable until the clock signal generator 122 enters the frequency-locked state at the time point T2'. When the frequency of the clock signal CLK_2 is not well controlled due to the clock signal generator 122 staying in the frequency-unlocked state, the data processing circuit 124 may fail to work normally. For example, the aforementioned picture flicker occurs.

To prevent the clock signal generator 122 from entering the frequency-unlocked state, the clock signal generator 112 is properly configured in this exemplary embodiment of the present invention. Specifically, the clock signal generator 112 generates the clock signal CLK_1 having the frequency transition FT1 from the first frequency $F_1$ to the second frequency $F_2$ during a second time period P2 which is longer than the first time period P1 such that the clock signal generator 122 would stay in the frequency-locked state during the second time period P2.

Figure 2:
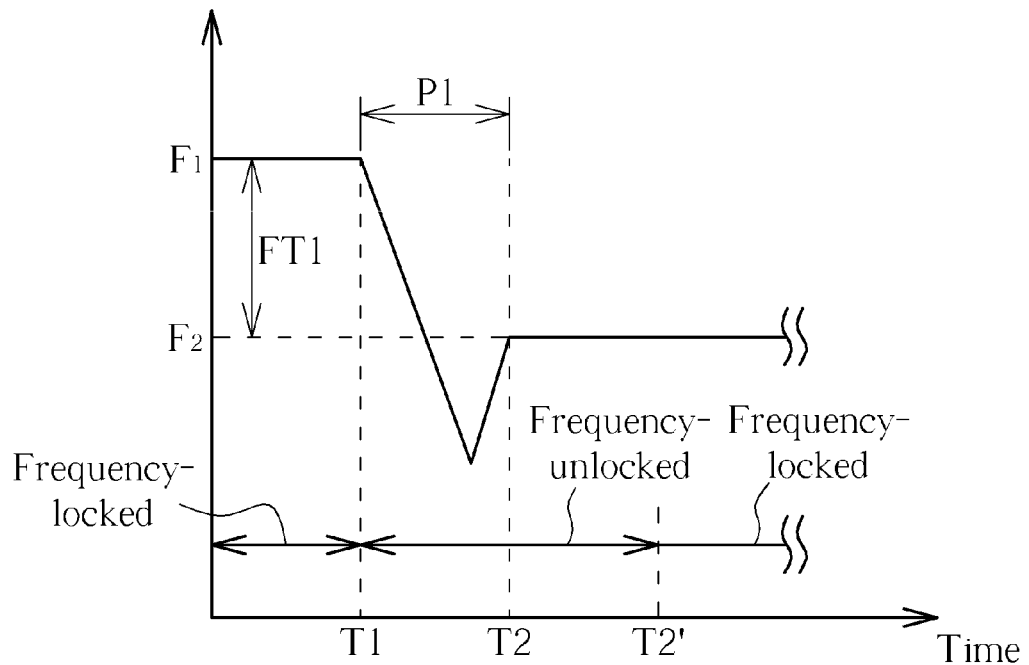
FIG. 2 is a diagram illustrating a hypothetical case where a clock signal generator at a receiving end enters a frequency-unlocked state due to a frequency change of a clock signal generated at a transmitting end.
Figure 3:
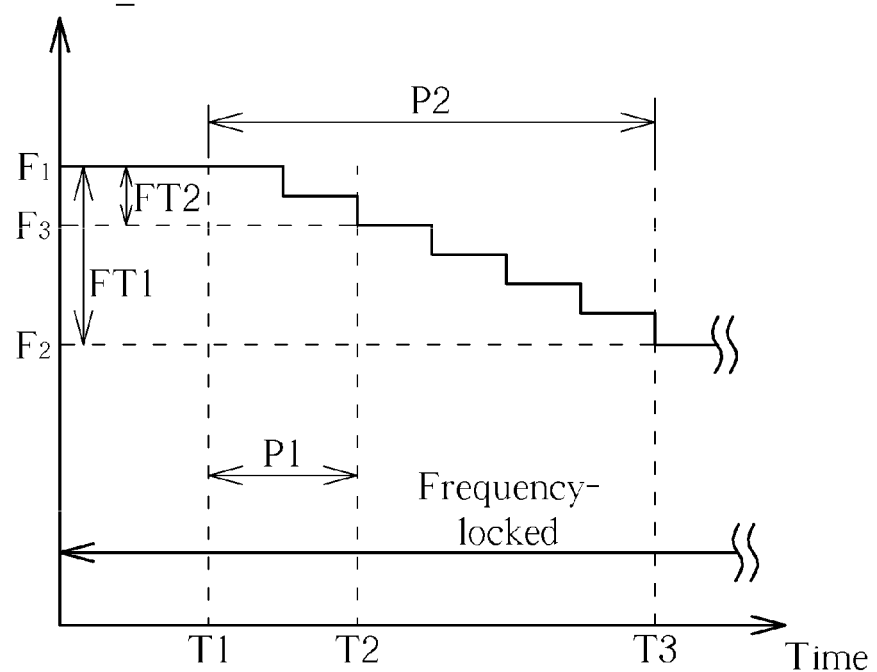
FIG. 3 is a diagram illustrating a case where the clock signal generator at the receiving end stays in a frequency-locked state when the clock signal generated at the transmitting end has a stepwise frequency transition.

To put it another way, the clock signal generator 122 enters the frequency-unlocked state if the clock signal CLK_1 has a first frequency transition from one frequency to another frequency during a specific time period. For example, the clock signal generator 122 enters the frequency-unlocked state if the clock signal CLK_1 has the frequency transition FT1, as shown in FIG. 2. Therefore, the clock signal generator 112 in this exemplary embodiment of the present invention is configured for generating the clock signal CLK_1 having a second frequency transition from one frequency to another frequency during the same specific time period, wherein the second frequency transition is less than the first frequency transition such that the clock signal generator 122 would stay in a frequency-locked state during the specific time period. For example, the clock signal generator 112 makes the clock signal CLK_1 have the frequency transition FT2 during the first time period P1, as shown in FIG. 3. Please note that the frequency transition FT2 is less than the frequency transition FT1.

Figure 4:
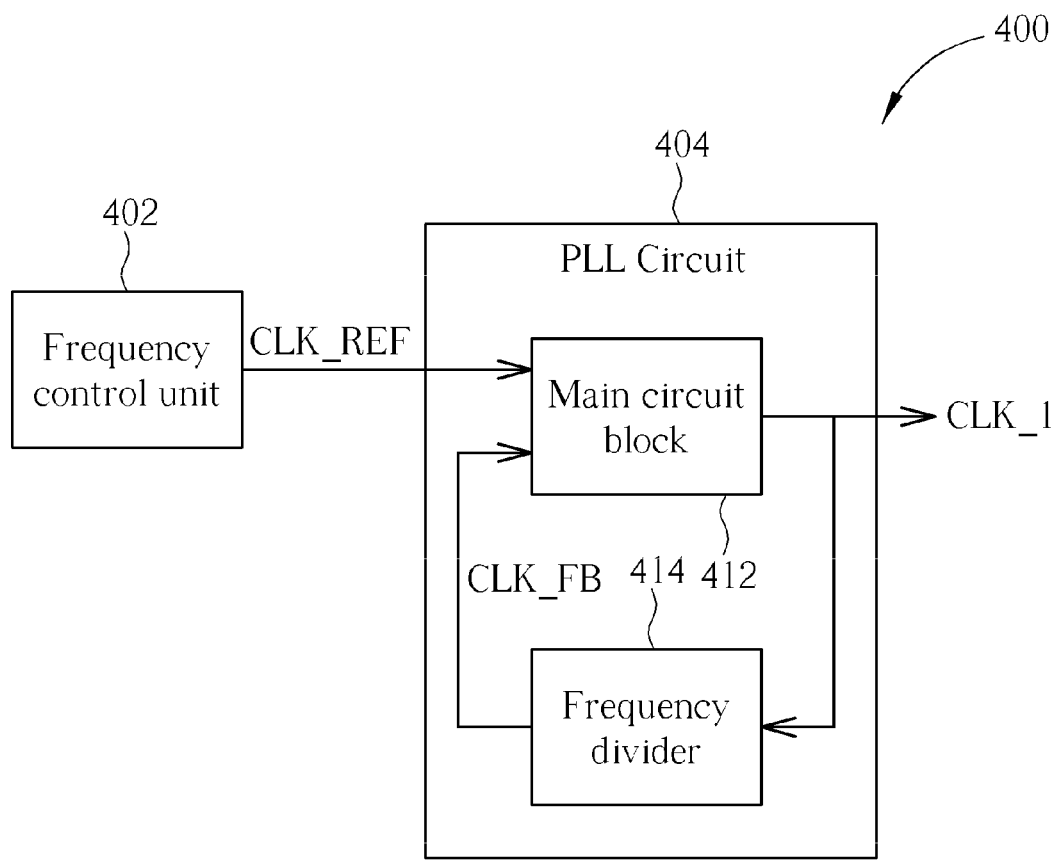
FIG. 4 is a diagram illustrating a first exemplary implementation of the transmitting end's clock signal generator shown in FIG. 1.

In one exemplary design, the clock signal generator 112 is configured to make the clock signal CLK_1 have a stepwise frequency transition from the first frequency $F_1$ to the second frequency $F_2$ during the second time period P2. Please refer to FIG. 4, which is a diagram illustrating a first exemplary implementation of the clock signal generator 112 shown in FIG. 1. The clock signal generator 400 includes a frequency control unit 402 and a phase-locked loop (PLL) circuit 404. The frequency control unit 402 is configured for generating a reference clock signal CLK_REF to the PLL circuit 404. The PLL circuit 404 is coupled to the frequency control unit 402, and implemented for receiving the reference clock signal CLK_REF and generating the desired clock signal CLK_1. The PLL circuit 404 may be implemented by any conventional PLL architecture. For example, the PLL circuit 404 includes a main circuit block 412 disposed at a forward path and a frequency divider 414 disposed at a feedback path. The frequency divider 414 generates a feedback clock CLK_FB by applying a fixed/predetermined frequency division factor upon the clock signal CLK_1 generated from the main circuit block 412 that may include a phase/frequency detector (PFD), a charge pump, a loop filter, and a voltage-controlled oscillator (VCO). For example, the frequency division factor is N, and the frequency $F_{CLK\_1}$ of the clock signal CLK_1 and the frequency $F_{CLK\_FB}$ of the feedback signal CLK_FB have the following relation: $F_{CLK\_1}=N\times F_{CLK\_FB}$.

During the above-mentioned second time period P2, the frequency control unit 402 sequentially applies a plurality of adjusting steps to a frequency of the reference clock signal CLK_REF. In response to the stepwise frequency transition of the reference clock signal CLK_REF, the clock signal CLK_1 generated from the main circuit block 412 also has a stepwise frequency transition, as shown in FIG. 3. To put it simply, the PLL circuit 404 is configured for receiving the reference clock signal CLK_REF and generating the clock signal CLK_1, having a stepwise frequency transition from the first frequency $F_1$ to the second frequency $F_2$ during the second time period P2, according to the reference clock signal CLK_REF properly controlled/adjusted by the preceding frequency control unit 402. Please note that the number of adjusting steps applied to the frequency of the reference clock signal CLK_REF during the second time period P2 is not limited to the number of steps included in the frequency transition FT1 as shown in FIG. 3. In a case where each adjusting step applied to the frequency of the reference clock signal CLK_REF is properly designed by referring to the tracking capability of the clock signal generator 122, the number of adjusting steps applied to the frequency of the reference clock signal CLK_REF during the second time period P2 may be adjusted, depending upon actual design consideration.

Figure 5:
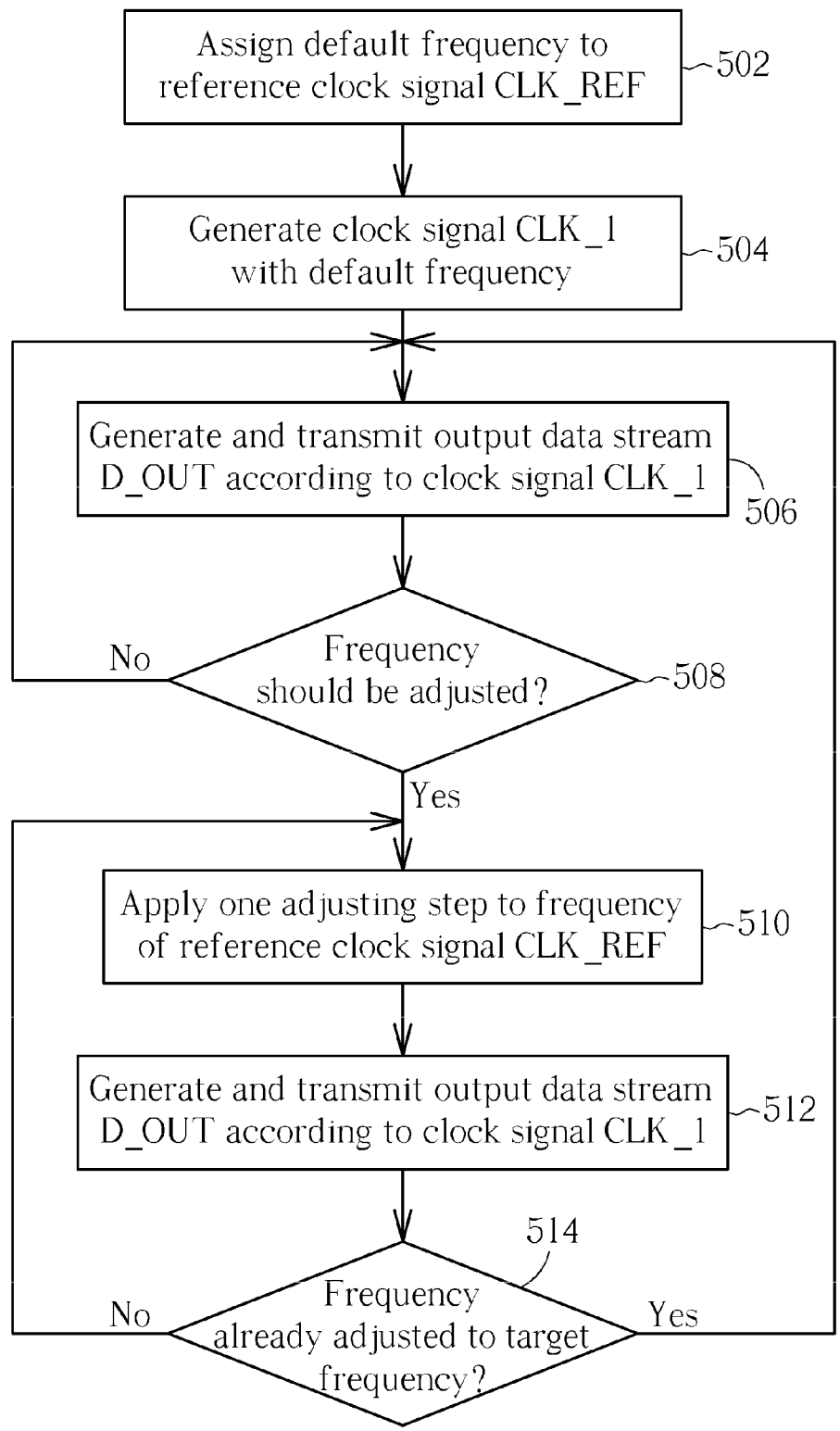
FIG. 5 is a flowchart illustrating a signal transmission method according to a first exemplary embodiment of the present invention.

FIG. 5 is a flowchart illustrating a signal transmission method according to a first exemplary embodiment of the present invention. Provided that the result is substantially the same, the steps are not required to be executed in the exact order shown in FIG. 5. The signal transmission method may be employed by the signal transmission system 100 having the clock signal generator 112 realized by the clock signal generator 400 shown in FIG. 4, and may be briefly summarized by following steps.

Step 502: The frequency control unit 402 assigns a default frequency to the reference clock signal CLK_REF.

Step 504: The PLL circuit 404 generates the clock signal CLK_1 with a default frequency (e.g., the first frequency $F_1$).

Step 506: The data processing circuit 114 generates and transmits the output data stream D_OUT according to the clock signal CLK_1.

Step 508: Check if the frequency of the clock signal CLK_1 should be adjusted. If yes, go to step 510; otherwise, go to step 506. By way of example, but not limitation, the frequency of the clock signal CLK_1 should be adjusted when the video source, the frame rate, or the video resolution is changed.

Step 510: The frequency control unit 402 applies one adjusting step to the frequency of the reference clock signal CLK_REF for increasing/decreasing the current frequency of the reference clock signal CLK_REF, wherein the adjusting step is properly designed by referring to the tracking capability of the clock signal generator 122 at the receiving end 104.

Step 512: The data processing circuit 114 generates and transmits the output data stream D_OUT according to the clock signal CLK_1.

Step 514: Check if the frequency of the reference clock signal CLK_REF reaches a target frequency (e.g., the second frequency $F_2$). If yes, go to step 506; otherwise, go to step 510.

In the beginning, the transmitting end 102 and the receiving end 104 may employ any conventional scheme to establish the data transmission therebetween (steps 502-506). For example, the data transmission may be established by three phases. In the first phase, a clock training sequence (i.e., one specific data sequence) is transmitted from the transmitting end 102 to the receiving end 104 such that the CDR of the receiving end 104 starts a training procedure for extracting the exact transmission data rate. In the second phase, the CDR of the receiving end 104 enters a frequency-locked state, and an alignment training sequence (i.e., another specific data sequence) is used for synchronizing the link logics of the transmitting end 102 and receiving end 104. After the first phase and the second phase are finished, the transmitting end 102 and the receiving end 104 enter the third phase to begin the normal data transmission operation.

When the clock signal CLK_1 requires a frequency adjustment (step 508), the frequency control unit 402 is responsible for increasing/decreasing the frequency of the reference clock signal CLK_REF in a stepwise manner (step 510). As the adjusting step applied to the frequency of the reference clock signal CLK_REF is properly designed by referring to the tracking capability of the clock signal generator 122 at the receiving end 104, the clock signal generator 122 stays in the frequency-locked state and correctly adjusts the frequency of the clock signal CLK_2 by tracking the frequency variation of the clock signal CLK_1. As a result, the data processing circuit 114 is allowed to keep generating and transmitting the output data stream D_OUT during the frequency adjusting procedure of the clock signal CLK_1 (step 512). In other words, the data transmission between the transmitting end 102 and the receiving end 104 is not terminated while the clock signal CLK_1 has a frequency transition from a current frequency to a target frequency (steps 510-514). Thus, the exemplary signal transmission system 100 is capable of solving the flicker problem without terminating the transmission process between the transmitting end (e.g., a TV SoC) 102 and the receiving end (e.g., a TV timing controller) 104.

Figure 6:
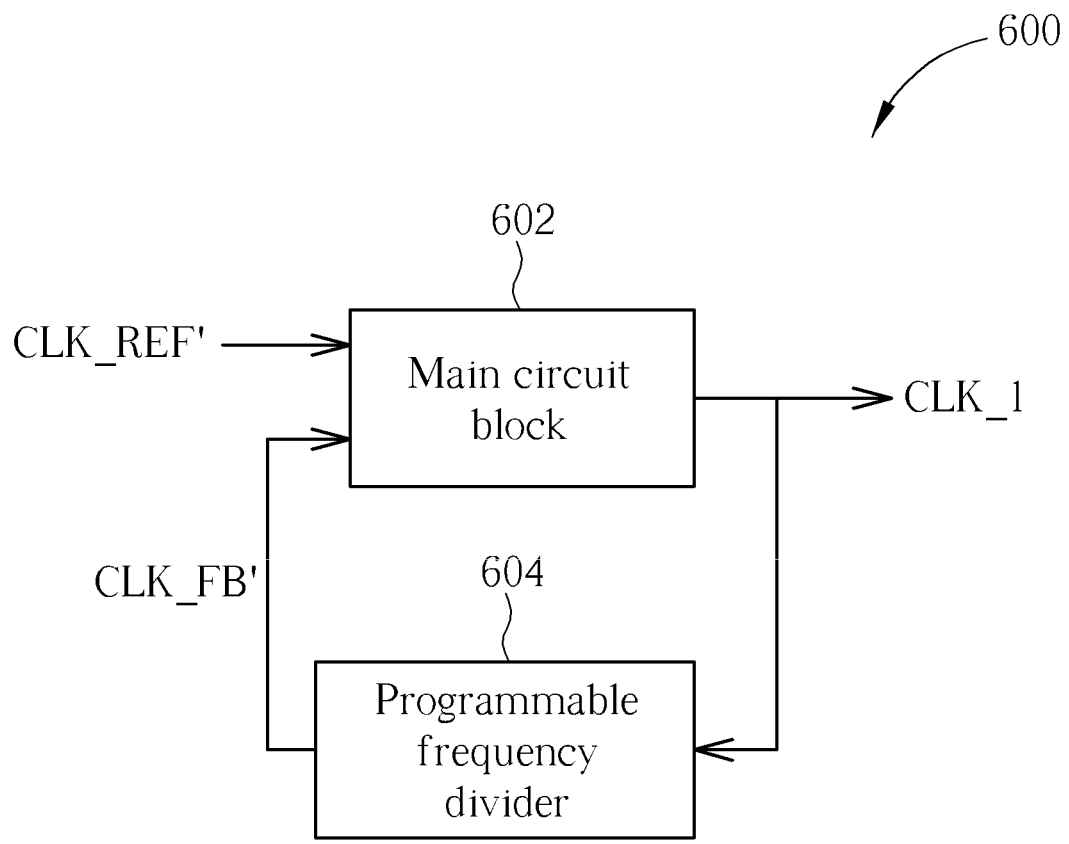
FIG. 6, which is a diagram illustrating a second exemplary implementation of the transmitting end's clock signal generator shown in FIG. 1.

Please refer to FIG. 6, which is a diagram illustrating a second exemplary implementation of the clock signal generator 112 shown in FIG. 1. The clock signal generator 600 is a phase-locked loop (PLL) circuit including a main circuit block 602 disposed at a forward path and a programmable frequency divider 604 disposed at a feedback path. The main circuit block 602 is configured for generating the clock signal CLK_1 according to a reference clock signal CLK_REF' and a feedback signal CLK_FB'. The hardware configuration of the main circuit block 602 may be identical to that of the main circuit block 412 shown in FIG. 4. Regarding the programmable frequency divider 604, it is coupled to the main circuit block 602 and implemented for generating the feedback signal CLK_FB' according to the clock signal CLK_1 and a programmable frequency division factor. In this exemplary implementation, the reference clock signal CLK_REF' has a fixed/predetermined frequency. However, during the second time period P2, the programmable frequency divider 604 sequentially applies a plurality of adjusting steps to the frequency division factor such that the clock signal CLK_1 has a stepwise frequency transition from the first frequency $F_1$ to the second frequency $F_2$, as shown in FIG. 3. Please note that the number of adjusting steps applied to the frequency division factor of the programmable frequency divider 604 is not limited to the number of steps included in the frequency transition FT1 shown in FIG. 3. In a case where each adjusting step applied to the frequency division factor of the programmable frequency divider 604 is properly designed by referring to the tracking capability of the clock signal generator 122, the number of adjusting steps applied to the frequency division factor of the programmable frequency divider 604 may be adjusted, depending upon the design consideration.

Figure 7:
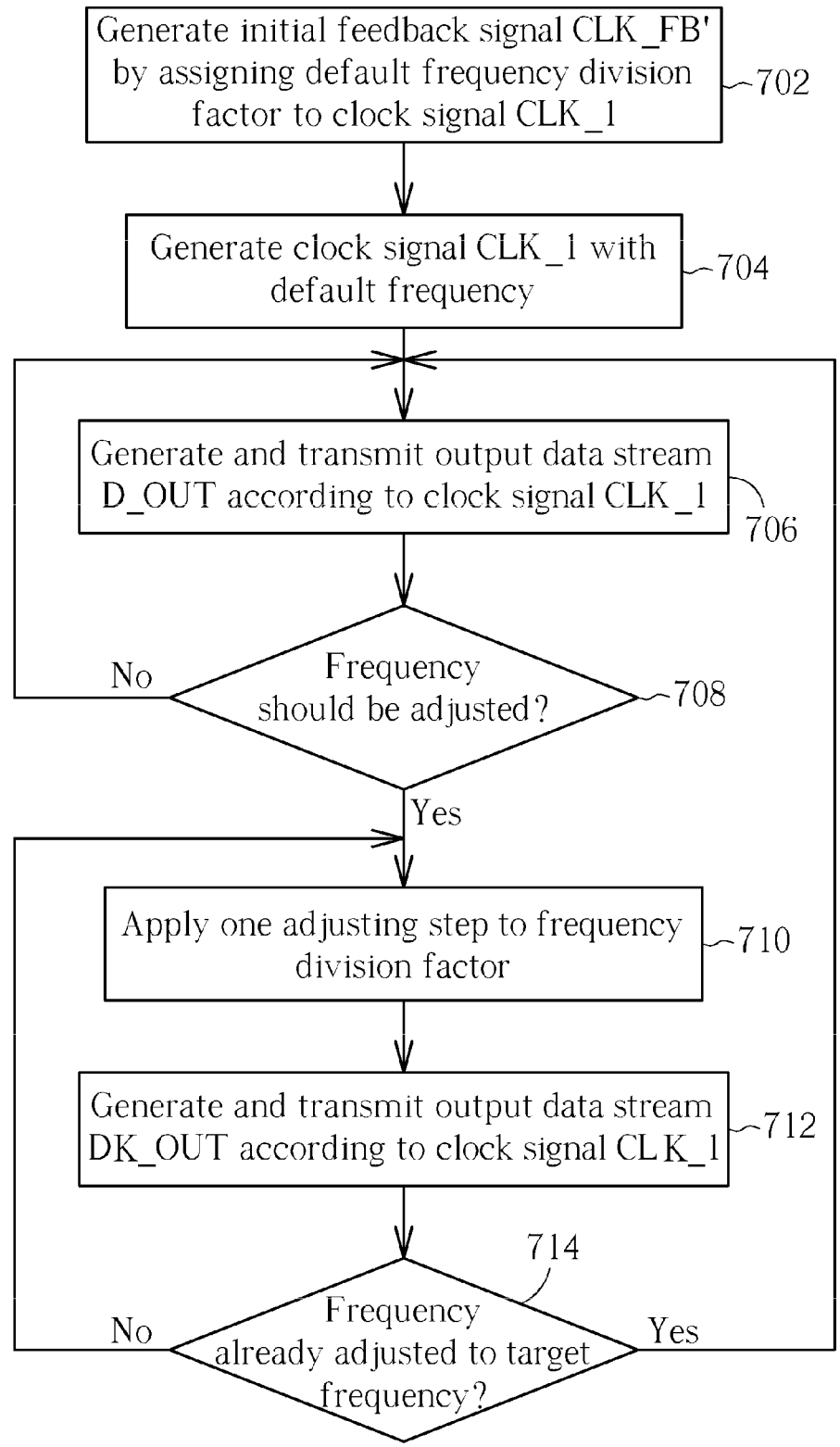
FIG. 7 is a flowchart illustrating a signal transmission method according to a second exemplary embodiment of the present invention.

FIG. 7 is a flowchart illustrating a signal transmission method according to a second exemplary embodiment of the present invention. Provided that the result is substantially the same, the steps are not required to be executed in the exact order shown in FIG. 7. The signal transmission method may be employed by the signal transmission system 100 having the clock signal generator 112 realized by the clock signal generator 600 shown in FIG. 6, and may be briefly summarized by following steps.

Step 702: The programmable frequency divider 604 generates an initial feedback signal CLK_FB' by assigning a default frequency division factor to the clock signal CLK_1.

Step 704: The main circuit block 602 generates the clock signal CLK_1 with a default frequency (e.g., the first frequency $F_1$).

Step 706: The data processing circuit 114 generates and transmits the output data stream D_OUT according to the clock signal CLK_1.

Step 708: Check if the frequency of the clock signal CLK_1 should be adjusted. If yes, go to step 710; otherwise, go to step 706. By way of example, but not limitation, the frequency of the clock signal CLK_1 should be adjusted when the video source, the frame rate, or the video resolution is changed.

Step 710: The programmable frequency divider 604 applies one adjusting step to the frequency division factor for increasing/decreasing the current frequency of the feedback signal CLK_FB', wherein the adjusting step is properly designed by referring to the tracking capability of the clock signal generator 122 at the receiving end 104.

Step 712: The data processing circuit 114 generates and transmits the output data stream D_OUT according to the clock signal CLK_1.

Step 714: Check if the frequency of the reference clock signal CLK_REF reaches a target frequency (e.g., the second frequency $F_2$). If yes, go to step 706; otherwise, go to step 710.

In the beginning, the transmitting end 102 and the receiving end 104 may employ any conventional scheme to establish the data transmission therebetween (steps 702-706). For example, the aforementioned three phases are sequentially performed for making the transmitting end 102 and the receiving end 104 begin the normal data transmission operation. When the clock signal CLK_1 requires a frequency adjustment (step 708), the programmable frequency divider 604 is responsible for increasing/decreasing the frequency of the feedback signal CLK_FB in a stepwise manner (step 710). As the adjusting step applied to the frequency division factor is properly designed by referring to the tracking capability of the clock signal generator 122 at the receiving end 104, the clock signal generator 122 stays in the frequency-locked state and correctly adjusts the frequency of the clock signal CLK_2 by tracking the frequency variation of the clock signal CLK_1. As a result, the data processing circuit 114 is allowed to keep generating and transmitting the output data stream D_OUT during the frequency adjusting procedure of the clock signal CLK_1 (step 712). In other words, the data transmission between the transmitting end 102 and the receiving end 104 is not terminated while the clock signal CLK_1 has a frequency transition from a current frequency to a target frequency (steps 710-714). Thus, the exemplary signal transmission system 100 is capable of solving the flicker problem without terminating the transmission process between the transmitting end (e.g., a TV SoC) 102 and the receiving end (e.g., a TV timing controller) 104.

Figure 8:
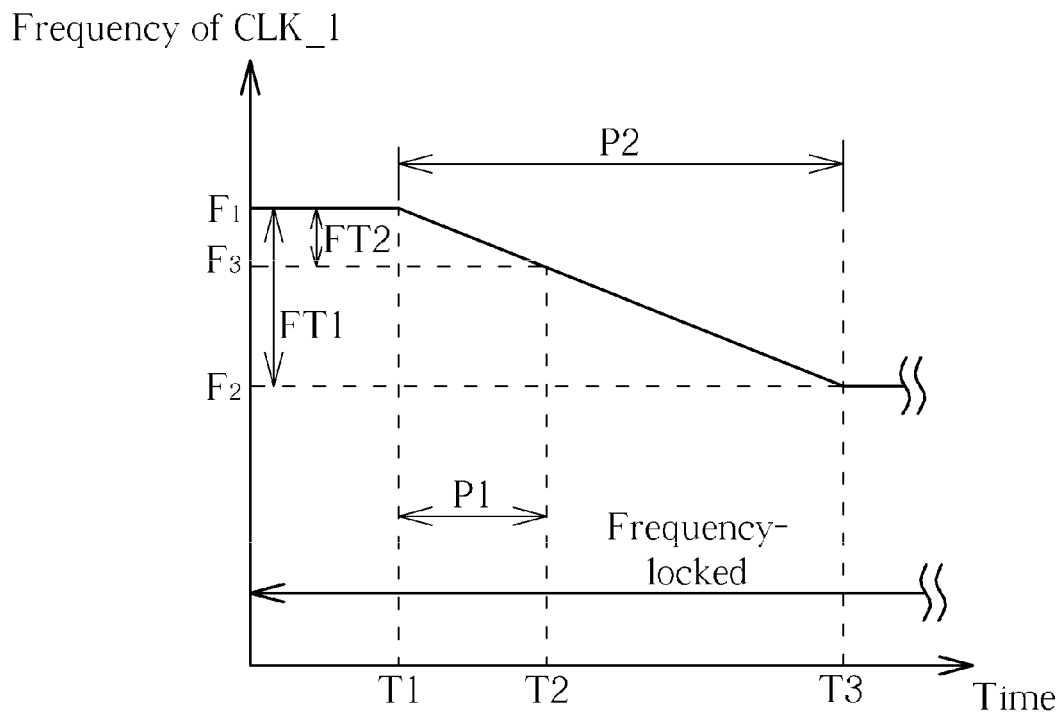
FIG. 8 is a diagram illustrating a case where the clock signal generator at the receiving end stays in a frequency-locked state when the clock signal generated at the transmitting end has a smooth frequency transition.

In the example shown in FIG. 3, the frequency transition from the first frequency $F_1$ to the second frequency $F_2$ is stepwise. However, this is not meant to be a limitation of the present invention. In an alternative design, the control signal CLK_1 may be controlled to have a smooth frequency transition, as shown in FIG. 8. The same objective of making the clock signal generator 122 stay in the frequency-locked state during the second time period P2 is achieved. Please note that if the adjusting steps mentioned above are small enough, the stepwise frequency transition may be regarded as a smooth frequency transition. In the following, another exemplary clock signal generator, particularly designed for offering a smooth frequency transition instead of a stepwise frequency transition, is disclosed.

Figure 9:
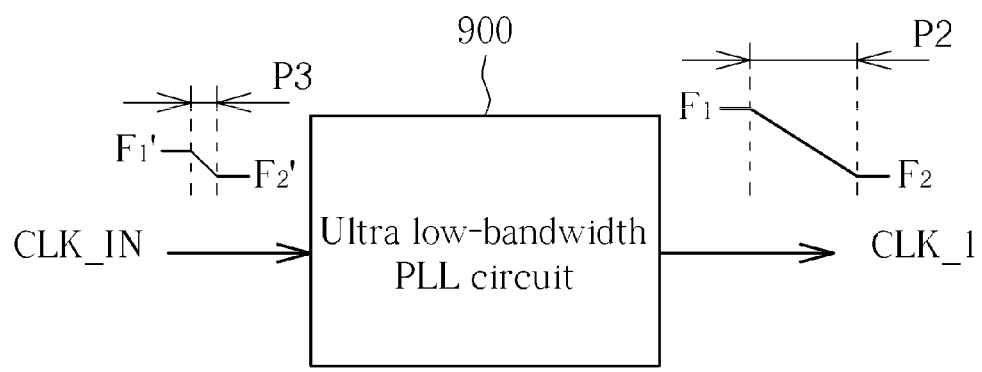
FIG. 9 is a diagram illustrating a third exemplary implementation of the transmitting end's clock signal generator shown in FIG. 1.

Please refer to FIG. 9, which is a diagram illustrating a third exemplary implementation of the clock signal generator 112 shown in FIG. 1. The clock signal generator is implemented by a PLL circuit configured to have a specific bandwidth. By way of example, but not limitation, the PLL circuit is an ultra low-bandwidth PLL circuit 900 which is used for generating the clock signal CLK_1 according to a reference clock signal CLK_IN. Therefore, due to the specific bandwidth of the ultra low-bandwidth PLL circuit 900, the clock signal CLK_1 would have a smooth frequency transition from the first frequency $F_1$ to the second frequency $F_2$ during the second time period P2 in response to the reference clock signal having a frequency transition from a third frequency $F_1'$ to a fourth frequency $F_2'$ during a third time period P3 that is shorter than the second time period P2. By way of example, but not limitation, the third time period P3 may be identical to the first time period P1 shown in FIG. 1. In other words, the reference clock signal CLK_IN fed into a conventional PLL circuit with a high bandwidth may have a sharp frequency transition which would accordingly make the clock signal generated from the conventional high-bandwidth PLL circuit have a sharp frequency transition. However, as the PLL circuit in this exemplary implementation is properly configured to be an ultra low-bandwidth PLL circuit, the clock signal CLK_1 will have a smooth frequency transition even though the reference clock signal CLK_IN fed into the ultra low-bandwidth PLL circuit has a sharp frequency transition. In this way, the clock signal generator 122 at the receiving end is capable of tracking the frequency variation of the clock signal CLK_1, and thus stays in the frequency-locked state during the second time period P2.

Please note that using a PLL circuit with an ultra low bandwidth is for illustrative purposes only, and is not meant to be a limitation of the present invention. Specifically, the clock signal generator 112 may be realized by a PLL circuit within any bandwidth setting as long as the bandwidth of the PLL circuit is properly configured according to a lock range of the clock signal generator (e.g., a CDR circuit) 122 at the receiving end 104. In this way, the frequency variation of the clock signal CLK_2 that is resulted from the frequency variation of the clock signal CLK_1 is guaranteed to be successfully tracked by the clock signal generator 122, and thus falls within the lock range of the clock signal generator 122.

Figure 10:
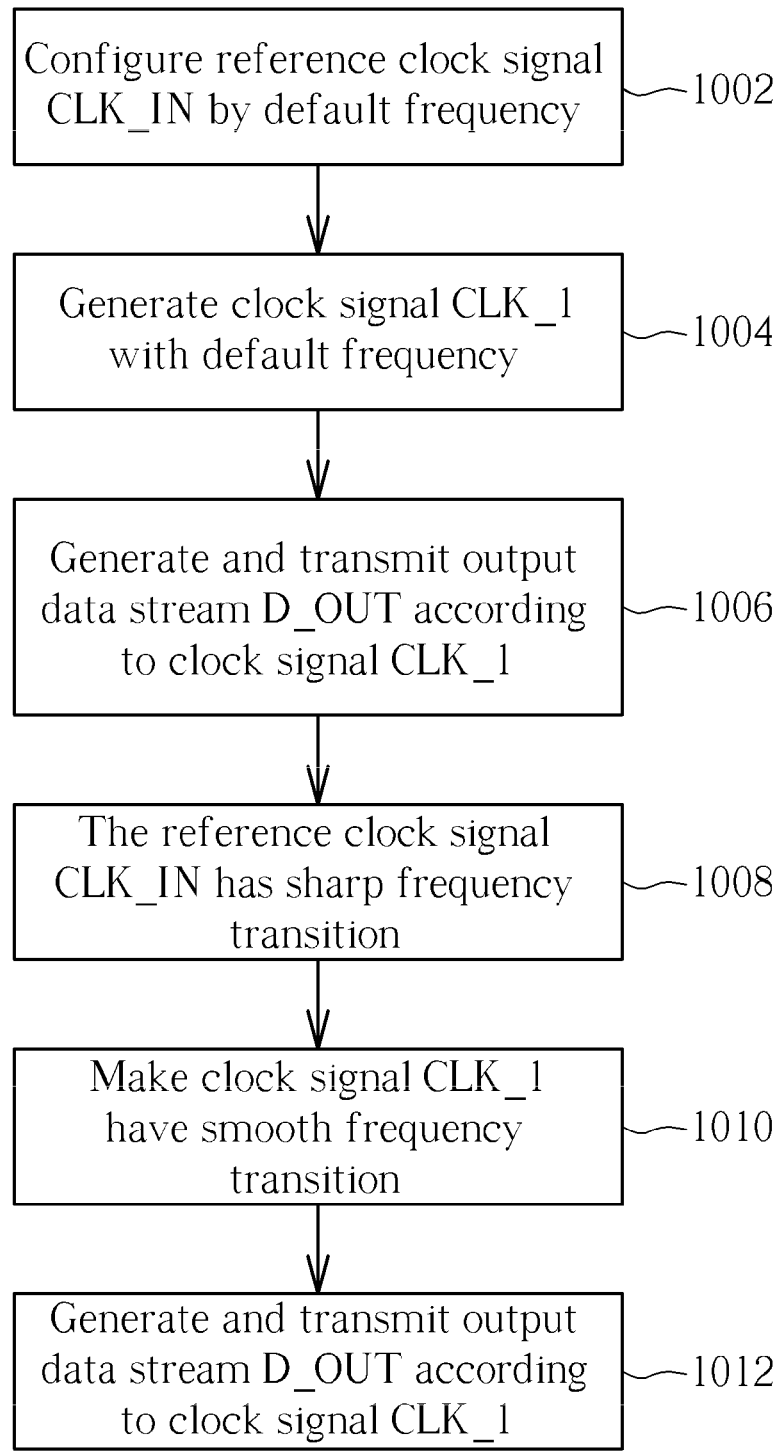
FIG. 10 is a flowchart illustrating a signal transmission method according to a third exemplary embodiment of the present invention.

FIG. 10 is a flowchart illustrating a signal transmission method according to a third exemplary embodiment of the present invention. Provided that the result is substantially the same, the steps are not required to be executed in the exact order shown in FIG. 10. The signal transmission method may be employed by the signal transmission system 100 having the clock signal generator 112 realized by the clock signal generator shown in FIG. 9, and may be briefly summarized by following steps.

Step 1002: Configure the reference clock signal CLK_IN by a default frequency.

Step 1004: The ultra low-bandwidth PLL circuit 900 generates the clock signal CLK_1 with a default frequency (e.g., the first frequency $F_1$).

Step 1006: The data processing circuit 114 generates and transmits the output data stream D_OUT according to the clock signal CLK_1.

Step 1008: The reference clock signal CLK_IN has a sharp frequency transition. By way of example, but not limitation, the frequency of the reference clock signal CLK_IN is adjusted when the video source, the frame rate, or the video resolution is changed.

Step 1010: The ultra low-bandwidth PLL circuit 900 makes the clock signal CLK_1 have a smooth frequency transition due to its properly designed bandwidth.

Step 1012: The data processing circuit 114 generates and transmits the output data stream D_OUT according to the clock signal CLK_1.

In the beginning, the transmitting end 102 and the receiving end 104 may employ any conventional scheme to establish the data transmission therebetween (steps 1002-1006). For example, the aforementioned three phases are sequentially performed for making the transmitting end 102 and the receiving end 104 begin the normal data transmission operation. As the bandwidth of the PLL circuit is properly designed by referring to the tracking capability/lock range of the clock signal generator 122 at the receiving end 104, the clock signal generator 122 stays in the frequency-locked state and correctly adjusts the frequency of the clock signal CLK_2 by tracking the frequency variation of the clock signal CLK_1. As a result, the data processing circuit 114 is allowed to keep generating and transmitting the output data stream D_OUT during the frequency adjusting procedure of the clock signal CLK_1. In other words, the data transmission between the transmitting end 102 and the receiving end 104 is not terminated while the clock signal CLK_1 has a frequency transition from a current frequency to a target frequency (steps 1008-1012).

Figure 11:
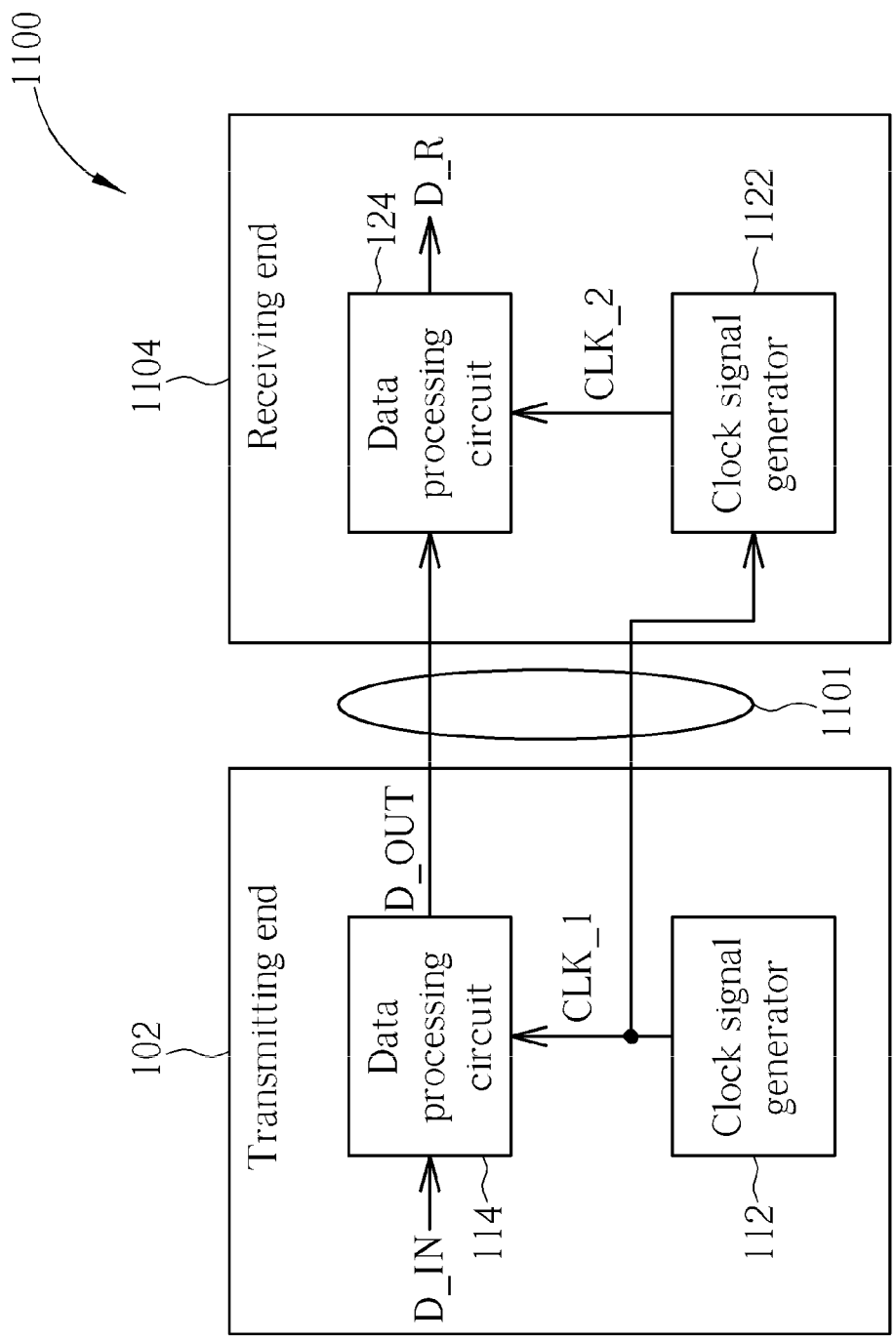
FIG. 11 is a diagram illustrating a signal transmission system according to a second exemplary embodiment of the present invention.

As mentioned above, the signal transmission system 100 employs a variable data rate scheme with embedded clock signal. Therefore, as the clock information is embedded in the transmitted output data stream D_OUT, no clock signal is additionally transmitted from the transmitting end 102 to the receiving end 104. However, the conception of the present invention may be applied to other signal transmission architecture. Please refer to FIG. 11, which is a diagram illustrating a signal transmission system according to a second exemplary embodiment of the present invention. The signal transmission system 1100 includes the aforementioned transmitting end 102 and a receiving end 1104, wherein the receiving end 1104 is coupled to the transmitting end 102 via a transmission link 1101. The major difference between the exemplary signal transmission systems 100 and 1100 is that the clock signal CLK_1 is delivered from the clock signal generator 112 at the transmitting end 102 to the clock signal generator 1122 at the receiving end 1104. By way of example, but not limitation, the transmission link 101 may be a low-voltage differential signaling (LVDS) link, and the clock signal generator 1122 may be a PLL circuit which generates the clock signal CLK_2 according to the clock signal CLK_1 transmitted via the transmitting end 102. Please note that the clock signal generator 112 of the signal transmission system 1100 may be implemented by one of the exemplary implementations shown in FIG. 4, FIG. 6, and FIG. 9. As a person can readily understand operation of the signal transmission system 1100 shown in FIG. 11 after reading above paragraphs pertinent to the signal transmission system 100 shown in FIG. 1, further description is omitted here for brevity.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A signal transmission system, comprising:
a first clock signal generator, configured for generating a first clock signal according to clock information derived from a transmitted signal, wherein the transmitted signal is changed in response to a frequency change of a second clock signal, and the first clock signal generator enters a frequency-unlocked state if the second clock signal has a frequency transition from a first frequency to a second frequency during a first time period; and
a second clock signal generator, configured for generating the second clock signal having the frequency transition from the first frequency to the second frequency during a second time period longer than the first time period such that the first clock signal generator stays in a frequency-locked state during the second time period.

2. The signal transmission system of claim 1, further comprising:
a data processing circuit, configured for generating an output data stream as the transmitted signal according to the second clock signal;
wherein the first clock signal generator is arranged to perform clock and data recovery (CDR) upon the transmitted signal.

3. The signal transmission system of claim 1, wherein the second clock signal is the transmitted signal.

4. The signal transmission system of claim 1, wherein the second clock signal generator comprises:
a frequency control unit, configured for generating a reference clock signal, and during the second time period, sequentially applying a plurality of adjusting steps to a frequency of the reference clock signal; and
a phase-locked loop (PLL) circuit, coupled to the frequency control unit, the PLL circuit configured for receiving the reference clock signal and generating the second clock signal, having a stepwise frequency transition from the first frequency to the second frequency during the second time period, according to the reference clock signal.

5. The signal transmission system of claim 1, wherein the second clock signal generator is a phase-locked loop (PLL) circuit comprising:
a main circuit block, configured for generating the second clock signal according to a reference clock signal and a feedback signal; and
a programmable frequency divider, coupled to the main circuit block, the programmable frequency divider configured for generating the feedback signal according to the second clock signal and a frequency division factor, and during the second time period, sequentially applying a plurality of adjusting steps to the frequency division factor such that the second clock signal has a stepwise frequency transition from the first frequency to the second frequency.

6. A signal transmission method, comprising:
generating a first clock signal according to clock information derived from a transmitted signal, wherein the transmitted signal is changed in response to a frequency change of a second clock signal, and the first clock signal enters a frequency-unlocked state if the second clock signal has a frequency transition from a first frequency to a second frequency during a first time period; and
generating the second clock signal having the frequency transition from the first frequency to the second frequency during a second time period longer than the first time period such that the first clock signal stays in a frequency-locked state during the second time period.

7. The signal transmission method of claim 6, further comprising:
generating an output data stream as the transmitted signal according to the second clock signal;
wherein the step of generating the first clock signal comprises:
performing clock and data recovery (CDR) upon the transmitted signal.

8. The signal transmission method of claim 6, wherein the second clock signal is the transmitted signal.

9. The signal transmission method of claim 6, wherein the step of generating the second clock signal comprises:
generating a reference clock signal, and during the second time period, sequentially applying a plurality of adjusting steps to a frequency of the reference clock signal; and
generating the second clock signal, having a stepwise frequency transition from the first frequency to the second frequency during the second time period, according to the reference clock signal.

10. The signal transmission method of claim 6, wherein the step of generating the second clock signal comprises:
generating the second clock signal according to a reference clock signal and a feedback signal;
generating the feedback signal by performing a frequency dividing operation upon the second clock signal according to a frequency division factor; and
during the second time period, sequentially applying a plurality of adjusting steps to the frequency division factor such that the second clock signal has a stepwise frequency transition from the first frequency to the second frequency.

11. A signal transmission system, comprising:
a first clock signal generator, configured for generating a first clock signal according to clock information derived from a transmitted signal, wherein the transmitted signal is changed in response to a frequency change of a second clock signal, and the first clock signal generator enters a frequency-unlocked state if the second clock signal has a first frequency transition from one frequency to another frequency during a specific time period; and
a second clock signal generator, configured for generating the second clock signal having a second frequency transition from one frequency to another frequency during the specific time period, wherein the second frequency transition is less than the first frequency transition such that the first clock signal generator stays in a frequency-locked state during the specific time period.

12. The signal transmission system of claim 11, further comprising:
a data processing circuit, configured for generating an output data stream as the transmitted signal according to the second clock signal;
wherein the first clock signal generator is arranged to perform clock and data recovery (CDR) upon the transmitted signal.

13. The signal transmission system of claim 11, wherein the second clock signal is the transmitted signal.

14. The signal transmission system of claim 11, wherein the second clock signal generator comprises:
- a frequency control unit, configured for generating a reference clock signal, and during the specific time period, sequentially applying a plurality of adjusting steps to a frequency of the reference clock signal; and
- a phase-locked loop (PLL) circuit, coupled to the frequency control unit, the PLL circuit configured for receiving the reference clock signal and generating the second clock signal, having the second frequency transition being a stepwise frequency transition during the specific time period, according to the reference clock signal.

15. The signal transmission system of claim 11, wherein the second clock signal generator is a phase-locked loop (PLL) circuit comprising:
- a main circuit block, configured for generating the second clock signal according to a reference clock signal and a feedback signal; and
- a programmable frequency divider, coupled to the main circuit block, the programmable frequency divider configured for generating the feedback signal according to the second clock signal and a frequency division factor, and during the specific time period, sequentially applying a plurality of adjusting steps to the frequency division factor such that the second clock signal has the second frequency transition being a stepwise frequency transition.

16. A signal transmission method, comprising:
- generating a first clock signal according to clock information derived from a transmitted signal, wherein the transmitted signal is changed in response to a frequency change of a second clock signal, and the first clock signal enters a frequency-unlocked state if the second clock signal has a first frequency transition from one frequency to another frequency during a specific time period; and
- generating the second clock signal having a second frequency transition from one frequency to another frequency during the specific time period, wherein the second frequency transition is less than the first frequency transition such that the first clock signal stays in a frequency-locked state during the specific time period.

17. The signal transmission method of claim 16, further comprising:
- generating an output data stream as the transmitted signal according to the second clock signal;
- wherein the step of generating the first clock signal comprises:
- performing clock and data recovery (CDR) upon the transmitted signal.

18. The signal transmission method of claim 16, wherein the second clock signal is the transmitted signal.

19. The signal transmission method of claim 16, wherein the step of generating the second clock signal comprises:
- generating a reference clock signal, and during the specific time period, sequentially applying a plurality of adjusting steps to a frequency of the reference clock signal; and
- generating the second clock signal, having the second frequency transition being a stepwise frequency transition during the specific time period, according to the reference clock signal.

20. The signal transmission method of claim 16, wherein the step of generating the second clock signal comprises:
- generating the second clock signal according to a reference clock signal and a feedback signal;
- generating the feedback signal by performing a frequency dividing operation upon the second clock signal according to a frequency division factor; and
- during the specific time period, sequentially applying a plurality of adjusting steps to the frequency division factor such that the second clock signal has the second frequency transition being a stepwise frequency transition.

* * * * *